United States Patent [19]

Belton, Jr.

[11] 4,443,766
[45] Apr. 17, 1984

[54] PRECISION DIGITAL SAMPLER

[75] Inventor: John P. Belton, Jr., Thousand Oaks, Calif.

[73] Assignee: The United States of America as represented by the Secretary of the Air Force, Washington, D.C.

[21] Appl. No.: 958,920

[22] Filed: Nov. 8, 1978

Related U.S. Application Data

[63] Continuation-in-part of Ser. No. 694,129, Jun. 15, 1976, abandoned.

[51] Int. Cl.³ .................... H03K 5/153; H03K 5/159
[52] U.S. Cl. .................................... 328/151; 328/56; 328/63; 307/352
[58] Field of Search ................ 307/352, 269, 262; 328/56, 63, 74, 151

[56] References Cited

U.S. PATENT DOCUMENTS

| | | | |
|---|---|---|---|
| 3,614,619 | 10/1971 | Huntsinger et al. | 324/78 Q |
| 3,851,261 | 11/1974 | Geiger | 328/165 |
| 3,879,661 | 4/1975 | Collins | 324/77 B |
| 3,909,716 | 9/1975 | Diekers | 324/78 D |

Primary Examiner—John Zazworsky
Attorney, Agent, or Firm—Donald J. Singer; Willard R. Matthews

[57] ABSTRACT

A precision digital sampler utilizes a sample rate clock providing pulses driving a tapped delay line where the total delay equals the Pulse Repetition Interval (PRI) of the sample clock. The outputs of the tapped delay line are tied to a buffer register having a storage cell for each delay line tap. The data from the delay line is stored in the register on receipt of a command signal designated "sample initiate command". In storing the outputs of the delay line, the state of the sample clock is known to the resolution of the taps. A decoder studies the states and the time for locating the leading edge of the sample clock is calculated. The calculated time is used by a control switching circuit to determine which tap should be enabled. The leading edge of the sample clock is thus enabled at the resolution of the delay line taps.

4 Claims, 2 Drawing Figures

PRECISION DIGITAL SAMPLER

STATEMENT OF GOVERNMENT INTEREST

The invention described herein may be manufactured and used by or for the Government for governmental purposes without the payment of any royalty thereon.

This is a continuation-in-part of co-pending patent application Ser. No. 694,129 entitled PRECISION DIGITAL SAMPLER filed by John P. Belton, June 15, 1976, now abandoned.

BACKGROUND OF THE INVENTION

In any digital sample rate generator, the precision or ambiguity as to the repeatability of taking samples of any waveform, is determined by the variation in the total propagation delay of logic elements. Deviation of the propagation delay is caused by fan out, temperature, and capacitive loading on the logic elements. The problem is usually minimized by designing with the fastest switching logic available, thus the packaging problems and the radio frequency interference problems to the analog portion of the system become very costly.

One prior art technique for sampling is the synchronization of a sample clock using a flip-flop on receipt of a sample initiate command pulse. This causes a sampling ambiguity equal to the PRI. The present invention is an improvement over the prior art in that the sampling ambiguity is not determined by the PRI but rather by the resolution established by the number of delay line taps.

SUMMARY OF THE INVENTION

A precision digital sampler is provided including a sample clock pulse generator which supplies pulses to a tapped delay line. The total delay of the delay line equals the PRI of the sample clock and the number of taps is selected to achieve the desired minimum ambiguity in taking the first sample. The outputs of the tapped delay line are tied to a buffer register. The buffer register includes one storage cell per delay line tap. The data from the delay line is stored in the register on receipt of a command. A decoder determines where the leading edge of the sample clock pulse was when the command was received. The location in time of the leading edge of the sample clock pulse is determined which is then used by a control switching circuit to determine which delay line tap should be enabled. The enabled tap then supplies the leading edge of the sample clock pulse.

It is a principal object of the invention to provide a new and improved precision digital sampler.

It is another object of the invention to provide a precision digital sampler that is less expensive than currently available devices.

These together with other objects features and advantages of the invention will become more readily apparent from the following detailed description when taken in conjunction with the illustrative embodiment in the accompanying drawings.

DETAILED DESCRIPTION OF THE PREFERRED EMBODIMENT

Figure 1:
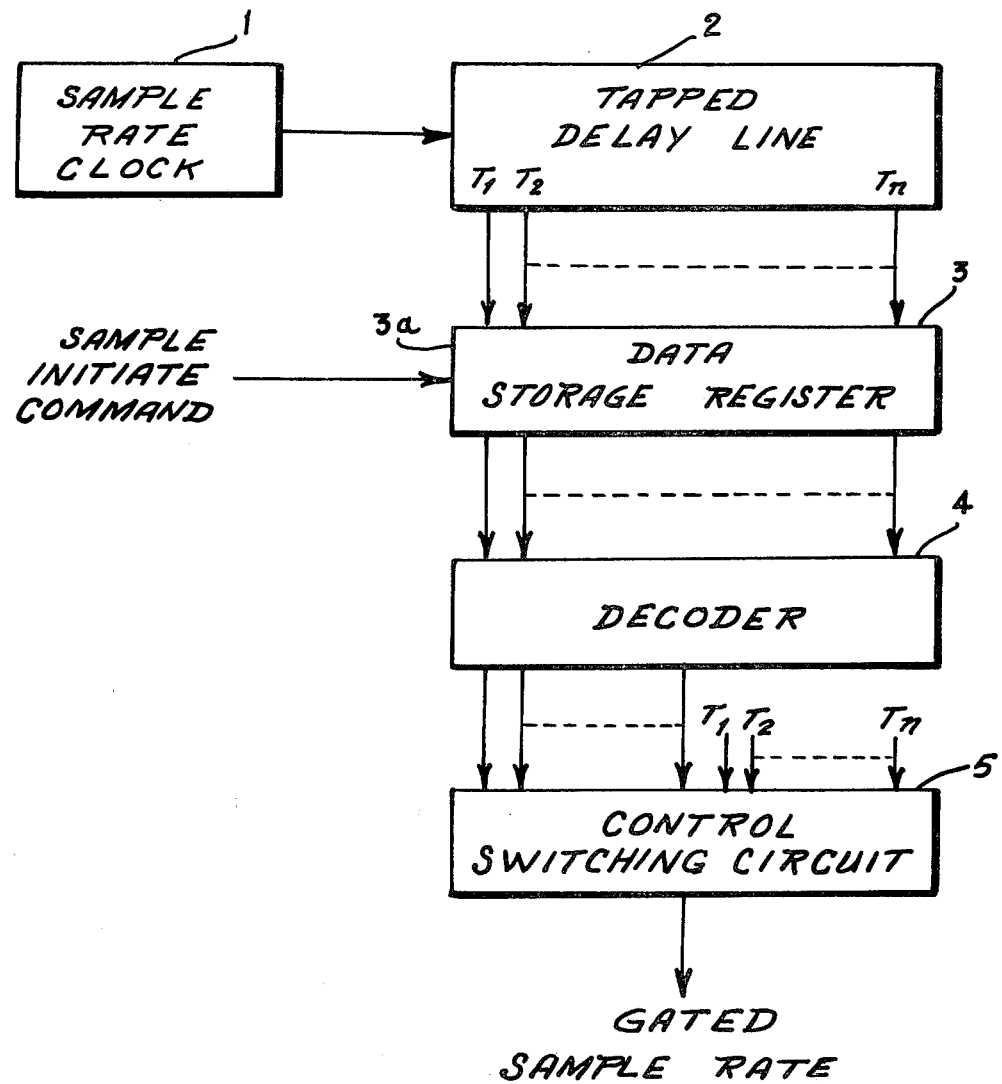
FIG. 1 is a block diagram of one presently preferred embodiment of the invention.

Referring now to FIG. 1, the basic components of the invention are shown to be a sample rate clock 1 tapped delay line 2 data storage register 3, decoder 4 and control switching circuit 5. Operation of the circuit is initiated by a command signal designated "sample initiate command".

The sample clock 1 is inputted to tapped delay line 2 as shown. Each output tap is inputted to a buffer register in data storage register 3 which is a simple flip flop storage device. On command "Sample Initiate Command" the output state of each tap of the delay line is stored within the buffer register. This data provides a time sample of the position of the sample rate clock within the delay line. Decoder circuit 4 analyzes this data to establish at which tap the leading edge of the sample clock is presently positioned. The control switching circuit based on the decision made by the decoder enables the specified tap of the delay line to provide the gated sample rate.

Sample rate clock 1 may be a free running oscillator generating a 50 percent duty cycle pulse at the desired sampling rate. The pulses from sample rate clock 1 drive tapped delay line 2 as noted above. Tapped delay line 2 includes output taps $T_1, T_2 \ldots T_n$. The total delay of tapped delay line 1 equals the PRI of sample clock 1 and the number of taps is established by the minimum ambiguity (the smallest interval of time in which one cannot establish where a pulse will occur) allowed in taking the first sample. For example, a 100 nanosecond delay line tapped every 10 nanoseconds would enable a 10 MHz sample clock to generate a maximum deviation in the sample time of 10 nanoseconds. Thus using this example, there is less technical risk and lower cost in packaging a 10 MHz sampling system with an ambiguity of 10 nanoseconds using a 10 MHz clock than a 100 MHz clock.

Figure 2:
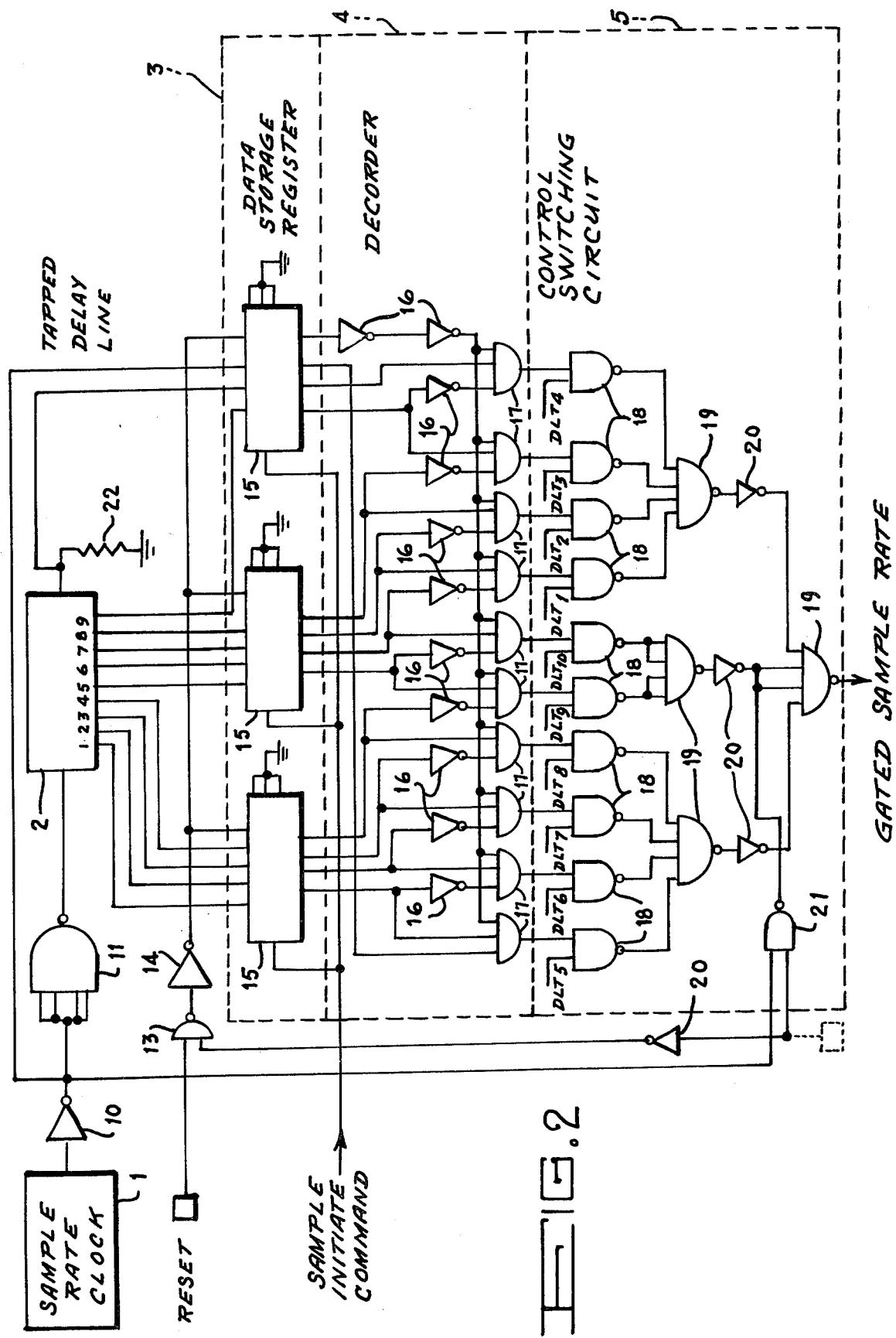
FIG. 2 is a detailed schematic diagram of the block diagram of FIG. 1.

The outputs of tapped delay line 2 are tied to buffer register 3 which is a storage device whose basic element is a flip flop. A typical integrated circuit used as a buffer register could be a SN74161 which is a 4 bit register. This register is illustrated in FIG. 2 and contains one flip flop (or storage cell) per delay line tap. The data from tapped delay line 2 is stored in register 3 on receipt of a sample initiate command.

The Sample Initiate Command is an enable pulse generated by an external circuit from the invention herein disclosed which commands the Precision Digital Sample circuit to begin generate sample clock pulses.

A typical example of such an input would be a video waveform that is to be sampled. The video waveform is inputted to a A/D converter and a voltage threshold circuit. Upon the video pulse exceeding the preset reference voltage on the threshold circuit, a pulse is developed called Sample Initiate Command to the Precision Digital Sample Circuit. This circuit then generates the clock pulses at a fixed frequency to the A/D converter to digitize the video pulse.

In storing the outputs of the delay line 2, the state of the sample clock is now known to the resolution of the taps.

State of the sample clock refers to establishing the leading edge of the sample clock. The leading edge of the sample rate clock is established by looking at each tap of the delay line simultaneously. Starting with the last tap, the decoder looks for the first tap in zero state.

Upon finding this location, the decoder knows the next tap in the one state is the leading edge of the sample clock.

The leading edge of the sample rate clock is the first translation from a zero to one state after receipt of the Sample Initiate Command. Decoder 4 in performing this function studies the states and determines where the leading edge of the sample rate clock was when the sample initiate command was received. Determining the location of the leading edge of the sample clock takes X nanoseconds, which is easily calculated. The calculated time is used by conventional control switching circuit 5 to determine which tap should be enabled. The leading edge of the sample clock is thus enabled at the resolution of the delay line taps. It is noted that the control switching circuit has inputs from decoder 4 and inputs $T_1, T_2 \ldots T_n$ from tapped delay line 2.

A detailed schematic diagram of the precision digital sampler described above is shown in FIG. 2. This Figure illustrates the tapped delay line 2 fed by sample rate clock 1 through inverter 10 and NAND gate 11 and connected to ground through resistor 22. The output taps of delay line 2 are fed to flip flop 15 of data storage register 3 and also to the NAND gates 18 of control switching circuit 5 as shown. Decoder 4 consists of the arrangement of inverter gates 16 and AND gates 17 shown. Decoder 4 operates from flip flops 15 and actuates control switching circuit 5. Control switching circuit 5 also includes NAND gates 19, 21 and inverter gates 20. A reset circuit includes NAND gate 13 and inverter gate 14 connected as shown. Actuation of the reset circuit clears the storage register 3 prior to the generation of each sample initiate command.

There has thus been disclosed a precision digital sampler having the ability to gate out a sample rate clock at a known time interval upon receipt of a sample initiate command. The number of taps within the delay line enable the system to be designed at a low sample clock rate while providing high resolution or minimum ambiguity.

While the invention has been described in its preferred embodiment it is understood that the words which have been used are words of description rather than words of limitation and that changes with the purview of the appended claims may be made without departing from the scope and spirit of the invention in its broader aspects.

What is claimed is:

1. A precision digital sampler comprising
    a sample rate clock,
    a tapped delay line having multiple taps connected to receive a sample clock pulse train therefrom,
    a data storage buffer register having a separate storage means for and connected to each delay line tap,
    means for applying a sample initiate command signal to said buffer register, said buffer register storing the output state of each delay line tap in response thereto,
    a decoder circuit connected to analyze the condition of said buffer register and detect the delay line tap at which the leading edge of the sample clock pulse is positioned, and
    a control switching circuit receiving inputs from each tap of said tapped delay line and gating pulses out of said tapped delay line in response to the output of said decoder circuit.

2. A precision digital sampler as defined in claim 1 wherein said sample rate clock is a free running oscillator generating a 50 percent duty cycle pulse at a discrete sampling rate.

3. A precision digital sampler as defined in claim 2, wherein the total delay of said tapped delay line equals the pulse repetition interval of said sample rate clock.

4. A precision digital sample rate generator being comprised of a sample rate clock generating a fifty percent duty cycle pulse, a tapped delay line having a preselected number of output taps, said tapped delay line receiving said fifty percent duty cycle pulse as an input, a data storage register connected to said output taps as inputs thereto, said data storage register containing one storage cell for each output tap, a sample initiate command also being an input to said data storage register, the data from said tapped delay line being stored in said data storage register on receipt by said data storage register of said sample initiate command, a decoder receiving the outputs from said data storage register, and a control switching circuit utilizing the outputs from said tapped delay line and said decoder to determine the output tap of said tapped delay line to be enabled, said control switching circuit also providing a gated sampled rate output.

* * * * *